United States Patent
Fujikawa (10) Patent No.: US 10,837,123 B2
(45) Date of Patent: Nov. 17, 2020

(54) METHOD OF MANUFACTURING SIC INGOT

(71) Applicant: SHOWA DENKO K.K., Tokyo (JP)

(72) Inventor: Yohei Fujikawa, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 126 days.

(21) Appl. No.: 16/225,260

(22) Filed: Dec. 19, 2018

(65) Prior Publication Data
US 2019/0194823 A1  Jun. 27, 2019

(30) Foreign Application Priority Data
Dec. 22, 2017 (JP) ................. 2017-246783

(51) Int. Cl.
| | |
|---|---|
| *C30B 23/06* | (2006.01) |
| *C30B 29/36* | (2006.01) |
| *C30B 23/00* | (2006.01) |
| *H01L 21/02* | (2006.01) |
| *H01L 21/66* | (2006.01) |
| *H01L 29/16* | (2006.01) |

(52) U.S. Cl.
CPC ............ *C30B 29/36* (2013.01); *C30B 23/002* (2013.01); *C30B 23/06* (2013.01); *H01L 21/02529* (2013.01); *H01L 22/12* (2013.01); *H01L 29/1608* (2013.01)

(58) Field of Classification Search
CPC ....... C30B 23/002; C30B 23/06; C30B 29/36; H01L 21/02529
See application file for complete search history.

(56) References Cited

U.S. PATENT DOCUMENTS

| | | | |
|---|---|---|---|
| 2009/0084309 A1 | 4/2009 | Sakamoto | |
| 2012/0280254 A1* | 11/2012 | Muto | ............... H01L 21/02529 257/77 |
| 2015/0194319 A1 | 7/2015 | Loboda et al. | |

FOREIGN PATENT DOCUMENTS

| | | |
|---|---|---|
| CN | 1950548 A | 4/2007 |
| CN | 101421442 A | 4/2009 |
| CN | 101536157 A | 9/2009 |
| CN | 101802273 A | 8/2010 |
| CN | 102822395 A | 12/2012 |
| CN | 104813439 A | 7/2015 |

(Continued)

OTHER PUBLICATIONS

Communication dated Aug. 4, 2020, from the State Intellectual Property Office of China in application No. 201811486783.3.

*Primary Examiner* — Robert M Kunemund
(74) *Attorney, Agent, or Firm* — Sughrue Mion, PLLC (57) ABSTRACT

A method of measuring a SiC ingot includes a measuring step of measuring a curving direction of an atomic arrangement plane of a SiC single crystal at least along a first direction passing through a center in plan view and a second direction intersecting with the first direction to obtain a shape of the atomic arrangement plane; and a crystal growth step of performing crystal growth using the SiC single crystal as a seed crystal, in which in a case where the shape of the atomic arrangement plane measured in the measuring step is a saddle type, a crystal growth condition in the crystal growth step is set such that a convexity of a second growth front at the end of crystal growth becomes larger than a convexity of a first growth front when an amount of crystal growth in the center of the seed crystal is 7 mm.

14 Claims, 9 Drawing Sheets

(56) References Cited

FOREIGN PATENT DOCUMENTS

| | | |
|---|---|---|
| CN | 105453220 A | 3/2016 |
| JP | 10-120497 A | 5/1998 |
| JP | 2004-002126 A | 1/2004 |
| JP | 2011-219294 A | 11/2011 |
| JP | 2017-065954 A | 4/2017 |

* cited by examiner

FIG. 14B

METHOD OF MANUFACTURING SIC INGOT

BACKGROUND OF THE INVENTION

Field of the Invention

The present invention relates to a method of manufacturing of a SiC ingot.

Priority is claimed on Japanese Patent Application No. 2017-246783, filed on Dec. 22, 2017, the content of which is incorporated herein by reference.

Description of Related Art

In silicon carbide (SiC), dielectric breakdown electric field is larger by one order of magnitude, and a band gap is three times larger than silicon (Si). In addition, the silicon carbide (SiC) has properties such as thermal conductivity which is about three times higher than silicon (Si). The silicon carbide (SiC) is expected to be applied to a power device, a high frequency device, and a high temperature operation device, and the like.

For devices such as semiconductors, a SiC epitaxial wafer on which an epitaxial film is formed on a SiC wafers is used. An epitaxial film provided on the SiC wafer by a chemical vapor deposition (CVD) method is an active region of a SiC semiconductor device.

For this reason, there is no breakage such as cracks, high quality SiC wafers with few defects are required. In this specification, the SiC epitaxial wafer means a wafer after formation of the epitaxial film, and the SiC wafer means a wafer before the epitaxial film is formed.

For example, Japanese Unexamined Patent Application, First Publication No. 2011-219294 discloses that cracks and distortion of the SiC ingot can be suppressed by performing concave growth in which a center portion is recessed more than an outer edge portion after convex growth in which the center portion protrudes more than the outer edge portion.

Further, for example, Japanese Unexamined Patent Application, First Publication No. 2017-65954 discloses that contamination of heterogeneous polymorphism is suppressed by making a height difference between a center point and an outer circumference point of an ingot in a final plane of crystal growth be a convex shape of 0.8 mm to 2.0 mm.

SUMMARY OF THE INVENTION

Basal plane dislocation (BPD) is one kind of killer defects of the SiC wafer. Some BPDs of the SiC wafer are also taken over by the SiC epitaxial wafer and become a cause of deterioration of forward characteristics when current flows in the forward direction of the device. The BPDs are defects considered to be one of the causes of slip occurring on the basal plane. As disclosed in Japanese Unexamined Patent Application, First Publication No. 2011-219294 and Japanese Unexamined Patent Application, First Publication No. 2017-65954, even if discussing only the shape of the crystal growth front, it was not possible to sufficiently suppress BPDs.

The present invention has been made in view of the above problems, an object of the present invention is to provide a method of manufacturing a SiC ingot with a small amount of curvature of an atomic arrangement plane.

As a result of intensive studies, the present inventors have found that there is a correlation between the amount of curvature of the atomic arrangement plane (lattice plane) of the SiC single crystal and the basal plane dislocation (BPD) density. That is, it has been found that a SiC single crystal with low BPD density can be obtained by reducing the amount of curvature of the atomic arrangement plane. In a case where a shape of the atomic arrangement plane is a predetermined shape, it was found that the curvature of the atomic arrangement plane is alleviated when crystal growth is performed under predetermined conditions.

That is, the present invention provides the following means in order to solve the above-mentioned problems.

That is, a first aspect of the present invention is the following method. (1) According to a first aspect of the present invention, there is provided a method of measuring a SiC ingot, the method including a measuring step of measuring a curving direction of an atomic arrangement plane of a SiC single crystal at least along a first direction passing through a center in plan view and a second direction intersecting with the first direction so as to obtain a shape of the atomic arrangement plane; and a crystal growth step of performing crystal growth using the SiC single crystal as a seed crystal, in a case where a shape of the atomic arrangement plane measured in the measuring step is a saddle type that the curving direction of the atomic arrangement plane is different in the first direction and the second direction, a crystal growth condition in the crystal growth step is set such that a convexity of a second growth front at the end of crystal growth becomes larger than a convexity of a first growth front when the amount of crystal growth in the center of the seed crystal is 7 mm.

(2) In the method of measuring a SiC ingot according to the above aspect, the crystal growth condition in the crystal growth step may be set such that the convexity is gradually increased toward second growth front from the first growth front.

(3) In the method of measuring a SiC ingot according to the above aspect, in the crystal growth step, a height difference of the growth front may be gradually increased toward the second growth front from the first growth front.

(4) In the method of measuring a SiC ingot according to the above aspect, a height difference of the first growth front and a growth front height difference of the second growth front may be 0.5 mm to 4.0 mm.

(5) In the method of measuring a SiC ingot according to the above aspect, the measuring step of obtaining the shape of the atomic arrangement plane may include a first substep of preparing the SiC single crystal, or the SiC single crystal that is sliced, as a sample, determining a diffraction plane at two points which are on a straight line passing through a center of the sample in plan view and at the same distance from the center, and performing XRD so as to obtain a difference $\Delta\theta$ between peak angles of X-ray diffraction as a difference between inclinations of the atomic arrangement planes at two points, a second substep of repeating the same operation as that in the first substep by changing the two points of positions one or more times, a third substep of obtaining a radius of curvature of the atomic arrangement plane from the obtained 2 or more $\Delta\theta$ and 2 or more distances from the center of the sample, and a fourth substep of obtaining an amount of curvature of the atomic arrangement plane from the obtained radius of curvature of the atomic arrangement plane and a radius of the sample.

(6) The method of measuring a SiC ingot according to the above aspect may further include a fifth substep of performing the first to fourth substeps in both the first direction and the second direction intersecting with the first direction.

(7) The method of measuring a SiC ingot according to the above aspect may further include a sixth substep of determining whether or not a curving direction of the atomic arrangement plane is different between the first direction and the second direction by evaluating the result of the fifth substep.

(8) In the method of measuring a SiC ingot according to the above aspect, the measuring step of obtaining the shape of the atomic arrangement plane may include a first substep of preparing the SiC single crystal, or the SiC single crystal that is sliced, as a sample, determining a diffraction plane at two points which are on a straight line passing through a center of the sample in plan view and at the same distance from the center, and performing XRD so as to obtain a difference $\Delta\theta$ between peak angles of X-ray diffraction as a difference between inclinations of the atomic arrangement planes at two points, a second substep of repeating the same operation as that in the first substep by changing the two points of positions one or more times, a third substep of obtaining each of relative atom positions of the atomic arrangement plane from the each obtained $\Delta\theta$ and each distance from the center of the sample, and fourth substep of evaluating each obtained atom position of the atomic arrangement plane.

(9) The method of measuring a SiC ingot according to the above aspect may further include a fifth substep of performing the first to fourth substeps in both the first direction and the second direction intersecting with the first direction.

(10) The method of measuring a SiC ingot according to the above aspect may further include a sixth substep of determining whether or not a curving direction of the atomic arrangement plane is different between the first direction and the second direction by evaluating the result of the fifth substep.

(11) In the method of measuring a SiC ingot according to the above aspect, the crystal growth step may be a growth step of the SiC ingot, the SiC ingot may include a c-plane growth region and a lateral growth region, and the convexity may be a value obtained by dividing a difference between an amount of crystal growth of the growth front of the SiC ingot at a center line C passing through the center of the seed crystal and extending in a stacking direction and an amount of crystal growth of the growth front of the SiC ingot at a boundary between the c-plane growth region and the lateral growth region, by a diameter of the growth front.

When using an evaluation method of a SiC single crystal according to the above aspects, it is possible to manufacture a SiC ingot in which the atomic arrangement plane is flattened.

DETAILED DESCRIPTION OF THE INVENTION

Hereinafter, preferred examples of the present embodiment will be described in detail with reference to the drawings as appropriate. In the drawings used in the following description, for convenience, characteristic portions are sometimes described in an enlarged manner, and sizes, ratios, and the like of the respective components may be different from actual ones. In addition, materials, sizes, and the like in the following description are simply exemplary examples, and the present invention is not limited thereto and can be carried out in appropriately modified manners within the scope of the gist of the present invention. Further, the present invention is not limited only to these examples, and it is possible to add, omit, replace or change the position, number, shape, material, constitution, and the like within the scope not deviating from the gist of the present invention.

[Method of Manufacturing SiC Ingot]

The method of manufacturing the SiC ingot according to the present embodiment includes a measuring step and a crystal growing step. In the measuring step, a curving direction of the atomic arrangement plane of the SiC single crystal is measured at least along a first direction passing through the center in plan view and a second direction, and a shape of the atomic arrangement plane is obtained. Here, the second direction is a direction intersecting with the first direction. In the measuring step, it is determined whether or not the measured SiC single crystal has a specific shape of atomic arrangement plane. In a case of having a specific shape, the following specific crystal growth step is carried out. In the crystal growth step, the crystal growth is performed such that the convexity of a second growth front at the end of crystal growth becomes larger than the convexity of the first growth front when an amount of crystal growth in the center of the seed crystal is 7 mm. Hereinafter, each step will be specifically described below.

<Measuring Step>

Figure 1:
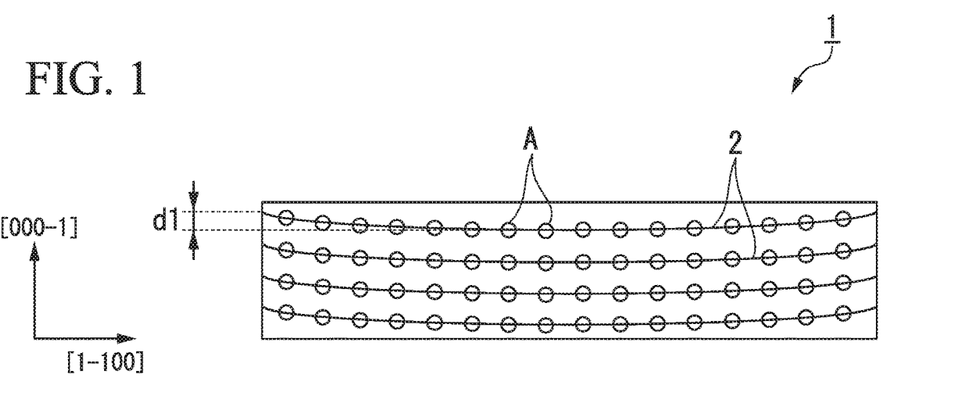
FIG. 1 is a schematic view showing an example of a section plane taken along a straight line extending in a first direction passing through a center in a plan view of a SiC single crystal.

FIG. 1 is a schematic diagram showing an example of a section plane taken along a straight line extending in a first direction passing through a center in a plan view of a SiC single crystal 1. The first direction can be set as any direction. In FIG. 1, the first direction is set as [1-100]. In FIG. 1, the upper side is set as a [000-1] direction, that is, a direction in which a carbon face (C-face, (000-1) plane) when cutting perpendicular to the <0001> direction. Hereinafter, a case where the first direction is [1-100] will be described as an example.

Here, the crystal orientation and the plane are expressed using the following parentheses as Miller indices. ( ) and { } are used when expressing the plane. ( ) is used to express a specific plane, and { } is used to express a generic name (collective plane) of equivalent planes due to the symmetry of crystals. On the other hand, <> and [ ] are used in particular to express a direction. [ ] is used to express a specific direction, and <> is used to express equivalent direction due to symmetry of crystals.

As shown in FIG. 1, the SiC single crystal 1 is a single crystal in which a plurality of atoms A are aligned. Therefore, as shown in FIG. 1, when a section plane of the SiC single crystal is viewed microscopically, an atomic arrangement plane 2 in which a plurality of atoms A are arranged is formed. The atomic arrangement plane 2 on the section plane is expressed as a line extending in a direction substantially parallel to the cutting direction obtained by connecting atoms A arranged along the section plane.

Figure 2:
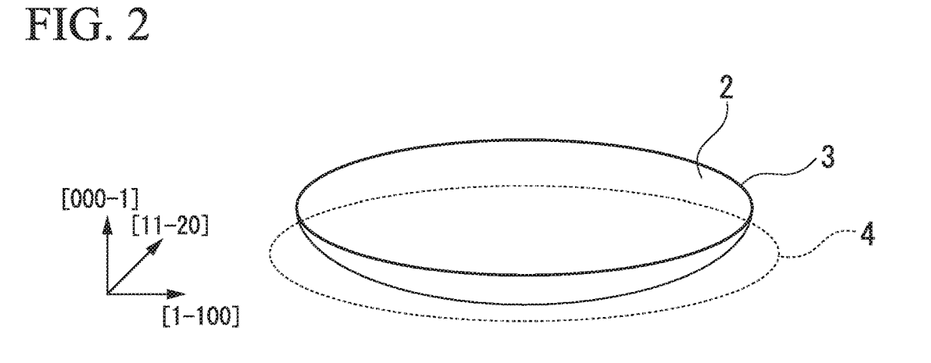
FIG. 2 is a diagram schematically showing an example of an atomic arrangement plane of the SiC single crystal.
Figure 3:
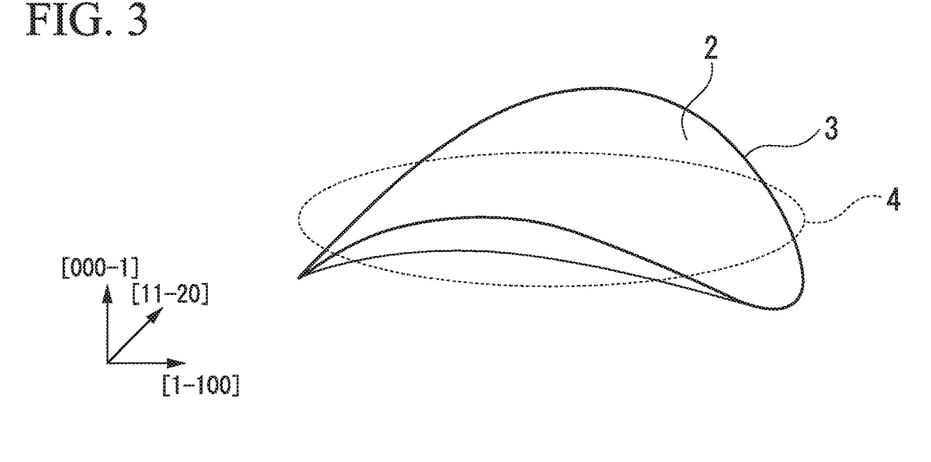
FIG. 3 is a diagram schematically showing another example of an atomic arrangement plane of the SiC single crystal.

The shape of the atomic arrangement plane 2 may be different depending on the direction of the section plane regardless of the shape of the outermost surface of the SiC single crystal 1. FIGS. 2 and 3 are diagrams schematically showing an example of different shapes of the atomic arrangement plane 2. The atomic arrangement plane 2 shown in FIG. 2 is a bowl type having a concave shape toward the center. That is, in any section plane parallel to the [000-1] direction and in each section planes of any section parallel to the [11-20] direction, the atomic arrangement line in which a plurality of the atoms A are arranged is a bowl type having a concave shape toward the center, and therefore, the atomic arrangement plane 2 shown in FIG. 2 is curved in the same direction when cut in the [1-100] direction and the [11-20] direction orthogonal to the [1-100] direction. On the other hand, the atomic arrangement plane 2 shown in FIG. 3 has a shape of a saddle type (potato chip shape) which is a concave shape in a predetermined section plane and a convex shape in different section planes when cutting in two orthogonal directions which are parallel to the [1-100] direction. Therefore, in the atomic arrangement plane 2 shown in FIG. 3, the curving direction is different in the [1-100] direction and the [11-20] direction orthogonal to the [1-100] direction.

That is, in order to accurately grasp the shape of the atomic arrangement plane 2, it is necessary to measure the shape of the atomic arrangement plane 2 of the SiC single crystal along at least two directions (the first direction and the second direction) that pass through the center in plan view, and intersect with each other. In the present specification, the shape of the atomic arrangement plane 2 in a case where the curving directions of the atomic arrangement plane 2 measured along two directions are different is defined as "saddle type". The crystal structure of the SiC single crystal 1 is a hexagonal crystal. Therefore, it is preferable to measure the shape of the atomic arrangement plane 2 along six directions symmetrical with respect to the center. For example, even in a case where the curving directions are the same as each other when the atomic arrangement plane 2 is measured along two specific directions intersecting with each other, it is also conceivable that the curving direction is different in a case where the third direction different from any of these directions is measured. However, the shape of the atomic arrangement plane 2 in this case is also one aspect of "saddle type". If the shape of the atomic arrangement plane 2 is measured along six directions symmetrical with respect to the center, it is possible to avoid the missing of the SiC single crystal which can proceed to the crystal growth step.

The shape of the atomic arrangement plane 2 can be measured by X-ray diffraction (XRD). The plane to be measured is determined according to the direction to be measured. Assuming that the measurement direction is [hkil], the measurement plane needs to satisfy the relationship (mh mk mi n). Here, m is an integer of 0 or more, and n is a natural number. For example, in a case of measuring in the [11-20] direction, as m=0 and n=4, the (0004) plane is selected, and as m=2 and n=16, the (22-416) plane and the like are selected. On the other hand, in a case of measuring in the [11-20] direction, as m=0 and n=4, the (0004) plane is selected, and as m=3 and n=16, the (3-3016) plane and the like are selected. That is, the measurement plane may be a different plane depending on the measurement direction, and the atomic arrangement plane 2 to be measured may not necessarily be the same plane. By satisfying the above relationship, it is possible to prevent erroneously recognizing lattice curvature in an a-plane or m-plane direction, which has little influence upon crystal growth, as lattice curvature in a c-plane direction.

The X-ray diffraction data is acquired at five points of a center, an end, and a midpoint between the center and the end along a predetermined direction. In a case where the atomic arrangement plane 2 is curved, since the reflection direction of the X-ray changes, the position of a ω angle of the peak of the X-ray diffraction image outputted at the center and the other portion varies. The curving direction of the atomic arrangement plane 2 can be obtained from the positional variation of this diffraction peak. The radius of curvature of the atomic arrangement plane 2 can also be obtained from the positional variation of the diffraction peak and the curvature of the atomic arrangement plane 2 can also be obtained from the radius of curvature of the atomic arrangement plane 2. The shape of the atomic arrangement plane 2 can be obtained from the curving direction and the amount of curvature of the atomic arrangement plane 2.

(Specific Description of Method of Measuring Shape of Atomic Arrangement Plane (Method 1))

A method of measuring the curving direction and the amount of curvature of the atomic arrangement plane from the measured value of the XRD of the outer peripheral end portion of the sample obtained by slicing the SiC single crystal (hereinafter, referred to as a wafer 20) will be described in detail with reference to the drawings as appropriate. Although the measuring method will be described using the wafer 20 as an example, it is also possible to measure an ingot-like SiC single crystal before being sliced using a similar method.

Figure 4:
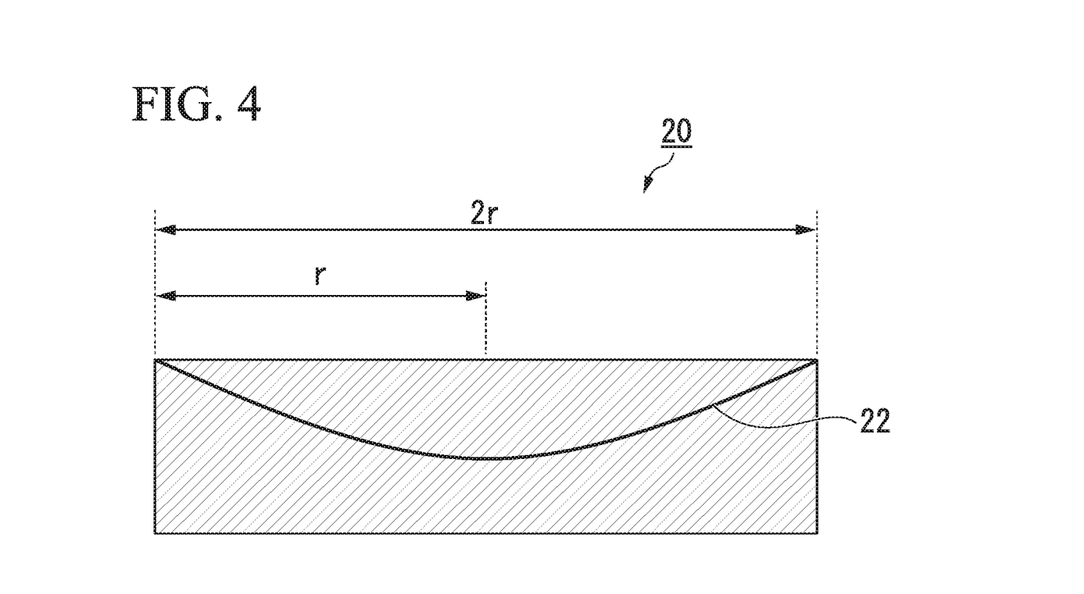
FIG. 4 is a schematic view showing an example of a section plane of the SiC wafer for specifically describing a method of measuring the shape of the atomic arrangement plane.

FIG. 4 schematically illustrates an example of a section plane passing through the center in plan view and cut along the measurement direction of the atomic arrangement plane, for example, the [1-100] direction. Assuming that the radius of the wafer 20 is r, the lateral length of the cross section is 2r. FIG. 4 also illustrates the shape of an atomic arrangement plane 22 in the wafer 20. As shown in FIG. 4, although the shape of the wafer 20 itself is flat, the atomic arrangement plane 22 may be curved in some cases. The atomic arrangement plane 22 shown in FIG. 4 is bilaterally symmetrical and curved in a concave shape. This symmetry is attributable to the fact that the manufacturing conditions of the SiC single crystal (ingot) are symmetrical with respect to the center. Note that, this symmetry does not need to be perfectly symmetric but means symmetry as an approximation that accepts blur due to fluctuations in manufacturing conditions and the like.

Figure 5:
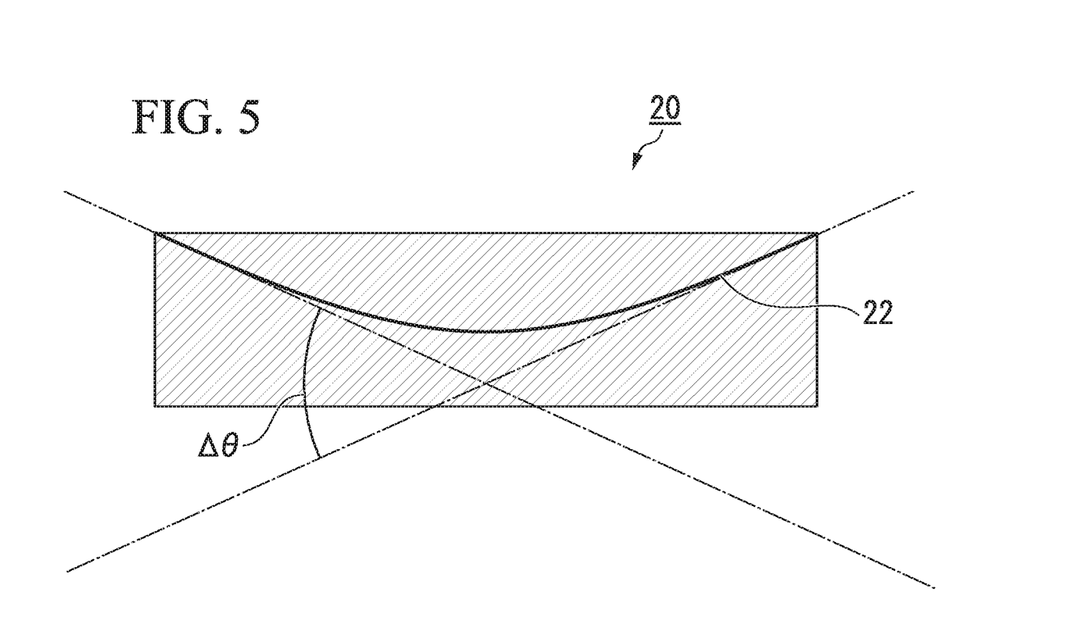
FIG. 5 is a schematic view showing an example of a section plane of the SiC wafer for specifically describing a method of measuring the shape of the atomic arrangement plane.

Next, as shown in FIG. 5, XRD is performed on both outer peripheral ends of the wafer 20, and a difference $\Delta\theta$ of X-ray diffraction peak angle between the measured two points is obtained. This $\Delta\theta$ represents the difference of inclination in the measured two atomic arrangement planes 22. As described above, for the diffraction plane used for the X-ray diffraction measurement, an appropriate plane is selected according to the section plane.

Figure 6:
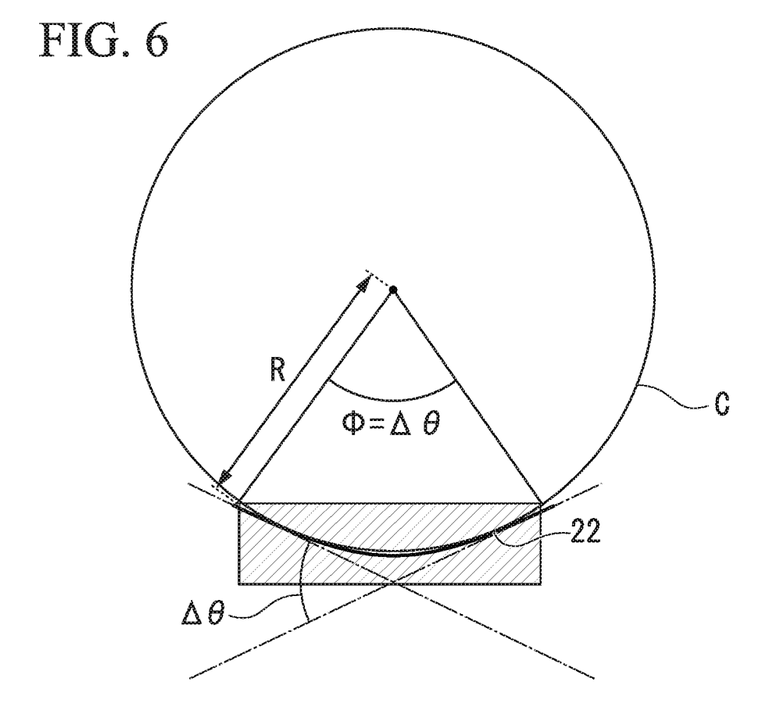
FIG. 6 is a diagram for specifically showing a method of measuring the shape of an atomic arrangement plane.

Next, as shown in FIG. 6, the radius of curvature of the curved atomic arrangement plane 22 is obtained from the obtained $\Delta\theta$. In FIG. 6, it is assumed that the curved plane of the atomic arrangement plane 22 of the wafer 20 is a part of a circle, and a circle C which is perpendicular to the measured two atomic arrangement planes is shown. Geometrically from FIG. 6, a central angle $\varphi$ of the sector including arcs with the contacts at both ends is equal to the difference $\Delta\theta$ between the measured X-ray diffraction peak angles. The radius of curvature of the atomic arrangement plane 22 corresponds to a radius R of the arc. The radius R in arc is obtained by the following relational expression.

$$R = \frac{r}{\sin\frac{\Delta\theta}{2}} \quad \text{Expression 1}$$

Figure 7:
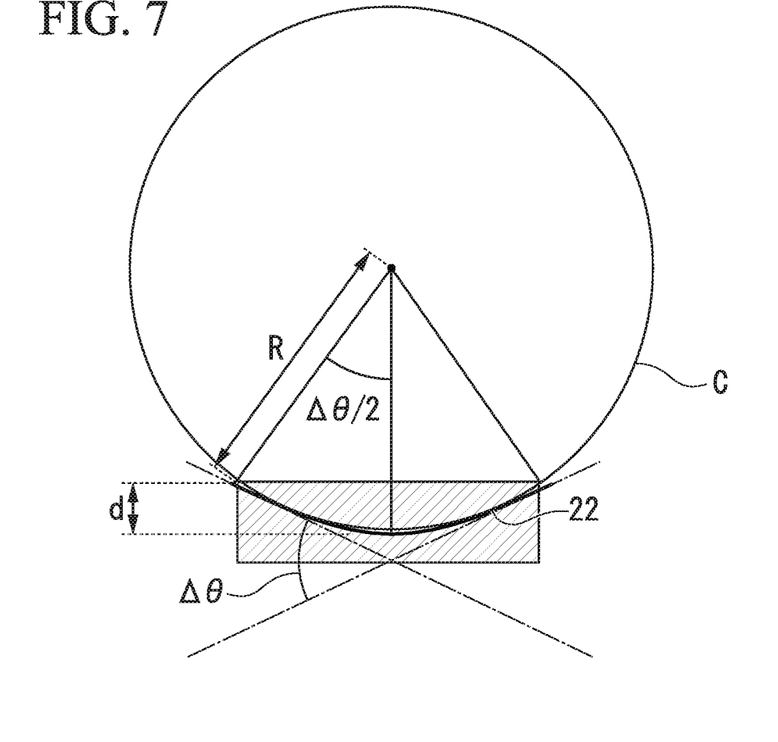
FIG. 7 is a diagram for specifically showing a method of measuring the shape of an atomic arrangement plane.

From the radius R of the circular arc and the radius r of the wafer 20, the amount of curvature d of the atomic arrangement plane 22 is obtained. As shown in FIG. 7, the amount of curvature of the atomic arrangement plane 22 corresponds to the difference between the radius of the arc and the distance (length) of the perpendicular line drawn from the center of the arc to the wafer. The distance (length) of the perpendicular line drawn from the center of the circular arc to the wafer 20 is calculated from triangular theorem and can be obtained by the following relational expression. In this specification, the amount of curvature d in a case where the radius of curvature is positive (concave shape) is defined as a positive value, and the amount of curvature d in a case where the radius of curvature is negative (convex shape) is defined as a negative value.

$$d = |R| - \sqrt{|R^2 - r^2|} \quad \text{Expression 2}$$

As mentioned above, it is also possible to measure R from only the measured values at both outer ends of wafer 20 of XRD. On the other hand, when this method is used, there is a possibility of misjudging the shape when there is local distortion or the like at the measurement points. Therefore, the X-ray diffraction peak angle is measured at a plurality of points, and the curvature per unit length is converted from the following expression. Although the number of points to be measured can be optionally selected, it may be selected from 2 to 10 times, for example, in a straight line passing through the center of the sample.

$$R = \frac{1}{\sin\left(\frac{1}{2} \cdot \frac{d\theta}{dr}\right)} \quad \text{Expression 3}$$

Figure 8:
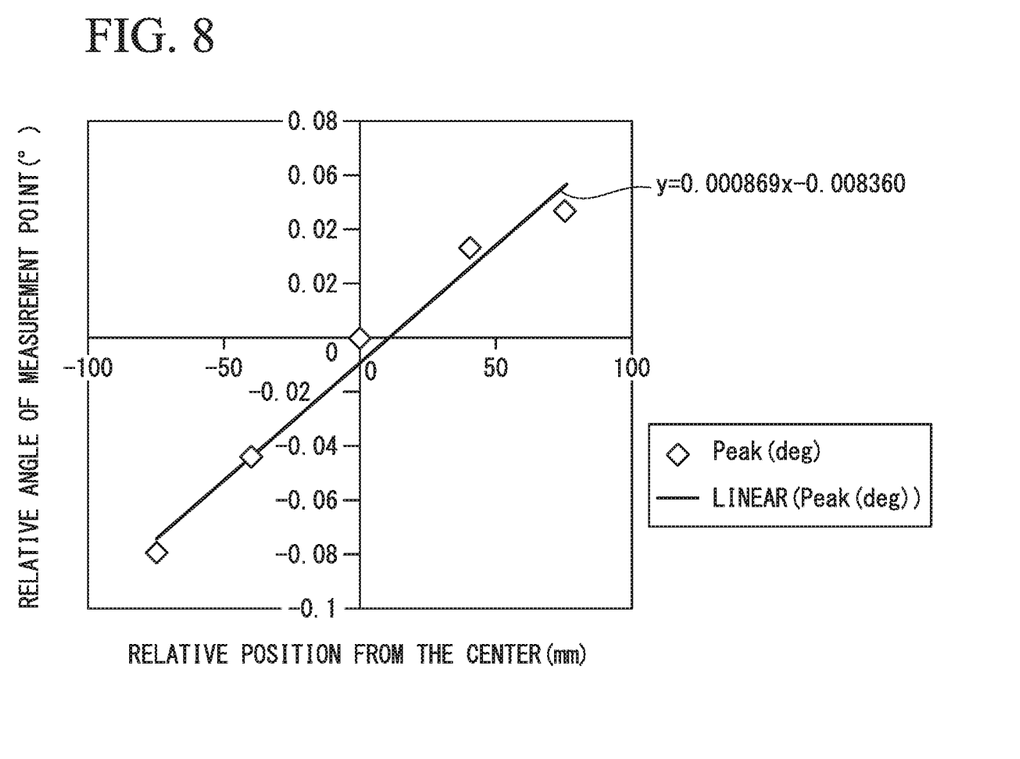
FIG. 8 illustrates an example in which a radius of curvature of the atomic arrangement plane is obtained from a plurality of XRD measurement points.

FIG. 8 illustrates an example in which a radius of curvature of the atomic arrangement plane is determined from a plurality of XRD measurement points. In FIG. 8, a horizontal axis is a relative position from the (wafer) center, and a vertical axis illustrates a relative diffraction peak angle of each measurement point with respect to a wafer center diffraction peak angle. That is the vertical axis illustrates a relative angle of measurement point. FIG. 8 illustrates an example in which the [1-100] direction of the wafer is measured and the measurement plane is set to (3-3016). The measurement is performed at five points. The five points are almost linearly aligned, and $d\theta/dr=8.69\times10^{-4}$ deg/mm is obtained from this inclination. By applying this result to the above expression, a concave shape (concave plane) with R=66 m can be calculated. From the radius R and the radius r (75 mm) of the wafer, the amount of curvature d of the atomic arrangement plane is obtained to be 42.6 µm.

Although the example in which the shape of the atomic arrangement plane is concave is described above, a case of the convex shape (convex plane) can be obtained in the same manner In the case of the convex shape, R is calculated as minus.

(Description of Another Measurement Method (Method 2) of Shape of Atomic Arrangement Plane)

Figure 9:
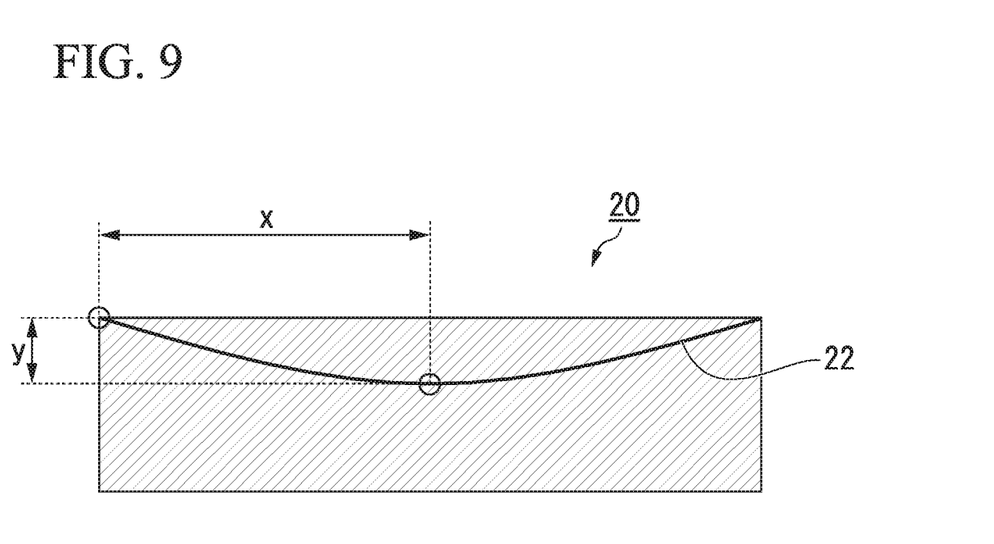
FIG. 9 is a schematic view showing another example of a section plane of the SiC wafer for specifically describing a method of measuring the shape of the atomic arrangement plane.

The shape of the atomic arrangement plane may be obtained by another method. FIG. 9 schematically illustrates an example of a section plane of the wafer 20 passing through the center in plan view and cut along the measurement direction of the atomic arrangement plane, for example, the [1-100] direction. In FIG. 9, a case where the shape of the atomic arrangement plane 22 is curved in a concave shape will be described as an example.

Figure 10:
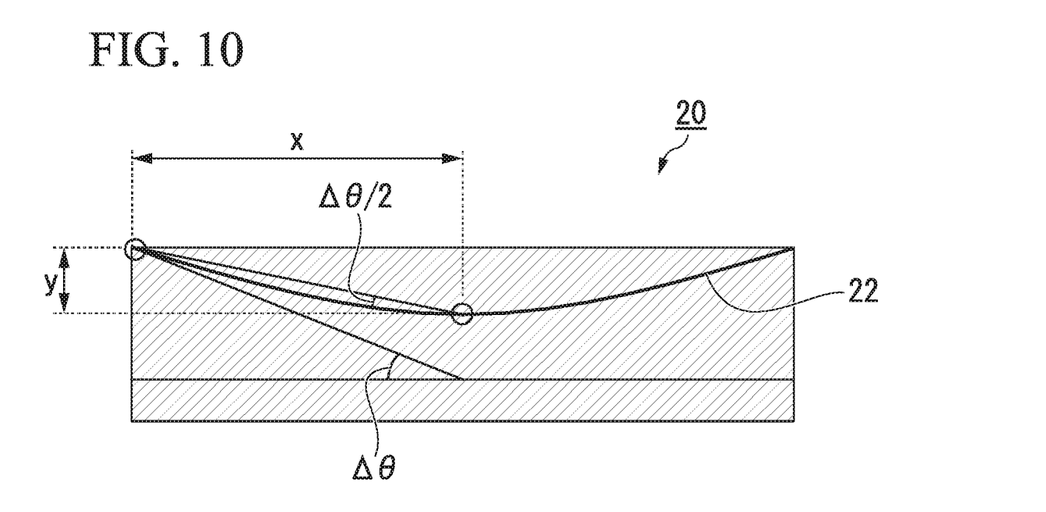
FIG. 10 is a schematic view showing another example of a section plane of the SiC wafer for specifically describing a method of measuring the shape of the atomic arrangement plane.

As shown in FIG. 9, diffraction peaks of X-ray diffraction are measured at two points at a distance x away from the center of the wafer 20 and the center of the wafer 20. From the symmetry of the manufacturing conditions of the ingot, the shape of the wafer 20 can be bilaterally symmetrical as an approximation, and it can be assumed that the atomic arrangement plane 22 becomes flat at the center portion of the wafer 20. Therefore, when the difference in the inclination between the atomic arrangement planes 22 at two points measured as shown in FIG. 10 is set to be $\Delta\theta$, a relative position y of the atomic arrangement plane 22, that is, a relative depth difference can be expressed in the following expression. Note that, half of the distance between two points is assumed to be x.

$$y = x\tan\left(\frac{\Delta\theta}{2}\right) \quad \text{Expression 4}$$

By changing the distance x from the center to measure at plurality of points, the relative atom position of the atomic arrangement plane 22 at the wafer center and the measurement point can be obtained at each point.

In this method, the relative positions of atoms on the atomic arrangement plane are obtained at each measurement point. Therefore, the amount of curvature of the local atomic arrangement plane can be obtained. Further, it is possible to evaluate the relative atom position of the atomic arrangement plane 22 in the entire wafer 20, for example, as a graph, which is intuitively useful for grasping the arrangement of the atomic arrangement plane 22.

Here, a case where an object to be measured is the wafer 20 is described as an example. Even in the case where a cut (sliced) body is a SiC ingot or the object to be measured cut from the SiC ingot, the amount of curvature of the atomic arrangement plane can be obtained in the same manner.

With the above procedure, the amount of curvature of the atomic arrangement plane 2 of the SiC single crystal is measured along at least two directions (the first direction and the second direction) that pass through the center in plan view, and intersect with each other. By obtaining the amount of curvature and the curving direction in each direction, the approximate shape of the atomic arrangement plane 2 as shown in FIGS. 2 and 3 can be obtained.

<Crystal Growth Step>

In the crystal growth step, the crystal growth is carried out using a SiC single crystal as a seed crystal. In the SiC single crystal used for the seed crystal, the shape of the atomic arrangement plane 2 is the saddle type. The SiC ingot can be manufactured, for example, by using a sublimation method. The sublimation method is a method of recrystallizing on a single crystal (seed crystal) a raw material gas generated by heating a raw material to obtain a large single crystal (ingot).

The radius of curvature of the atomic arrangement plane 2 of the SiC single crystal 1 used as a seed crystal is preferably 28 m or more. As the radius of curvature is increased, the atomic arrangement plane 2 becomes flat. In a case where a diameter of the SiC single crystal is 150 mm or more, the maximum value of the amount of curvature of the atomic arrangement plane 2 is preferably 100 μm or less. When the amount of curvature of the atomic arrangement plane 2 is large, it is difficult to completely flatten the atomic arrangement plane 2 by crystal growth once.

Figure 11:
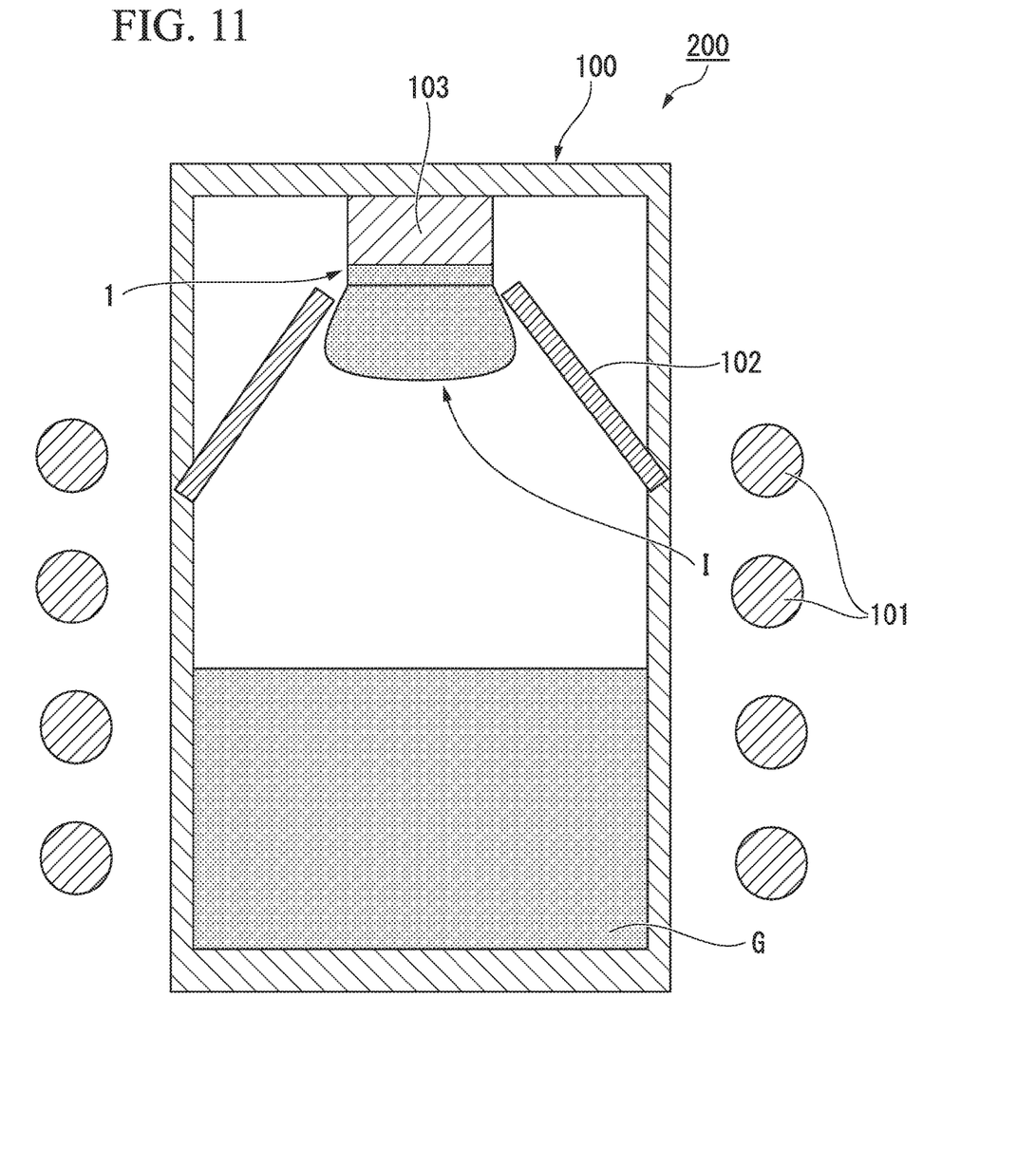
FIG. 11 is a schematic sectional view of an example of a manufacturing apparatus used in a sublimation method.

FIG. 11 is a schematic sectional view of an example of a manufacturing apparatus used in a sublimation method. A manufacturing apparatus 200 includes a crucible 100 and a coil 101. A heating element (not shown) that generates heat by induction heating of the coil 101 may be provided between the crucible 100 and the coil 101. Inside the crucible 100, a tapered guide 102 which expands from a pedestal 103 toward a raw material G is provided.

The crucible 100 has the pedestal 103 provided at a position facing the raw material G. As a seed crystal, the SiC single crystal 1 is attached to the pedestal 103.

The coefficient of thermal expansion of the pedestal 103 is preferably close to the coefficient of thermal expansion of the SiC single crystal 1 to be attached. Specifically, a difference in the coefficient of thermal expansion is preferably $0.3 \times 10^{-6}$/° C. or less. Note that, the coefficient of thermal expansion described here means a coefficient of thermal expansion in a temperature range where the crystal growth is performed using the SiC single crystal 1 as a seed crystal and means a temperature in the vicinity of 2000° C. For example, the coefficient of thermal expansion of graphite can be selected within the range of $4.3 \times 10^{-6}$/° C. to $7.1 \times 10^{-6}$/° C. depending on the processing conditions, the contained material, and the like. Since the difference in the coefficient of thermal expansion between the pedestal 103 and the SiC single crystal 1 is small, it is possible to prevent the SiC single crystal 1 from warping due to the difference in the coefficient of thermal expansion during single crystal growth, and the atomic arrangement plane 2 from being curved.

When an alternating current is applied to the coil 101, the crucible 100 is heated, and a raw material gas is generated from the raw material G. The generated raw material gas is supplied to the SiC single crystal 1 installed on the pedestal 103 along the tapered guide 102. By supplying the raw material gas to the SiC single crystal 1, the SiC ingot I is crystal-grown on a main plane of the SiC single crystal 1. The crystal growth plane of the SiC single crystal 1 is preferably a c-plane or a plane provided with an off angle of 10° or lower from the c-plane.

Figure 12:
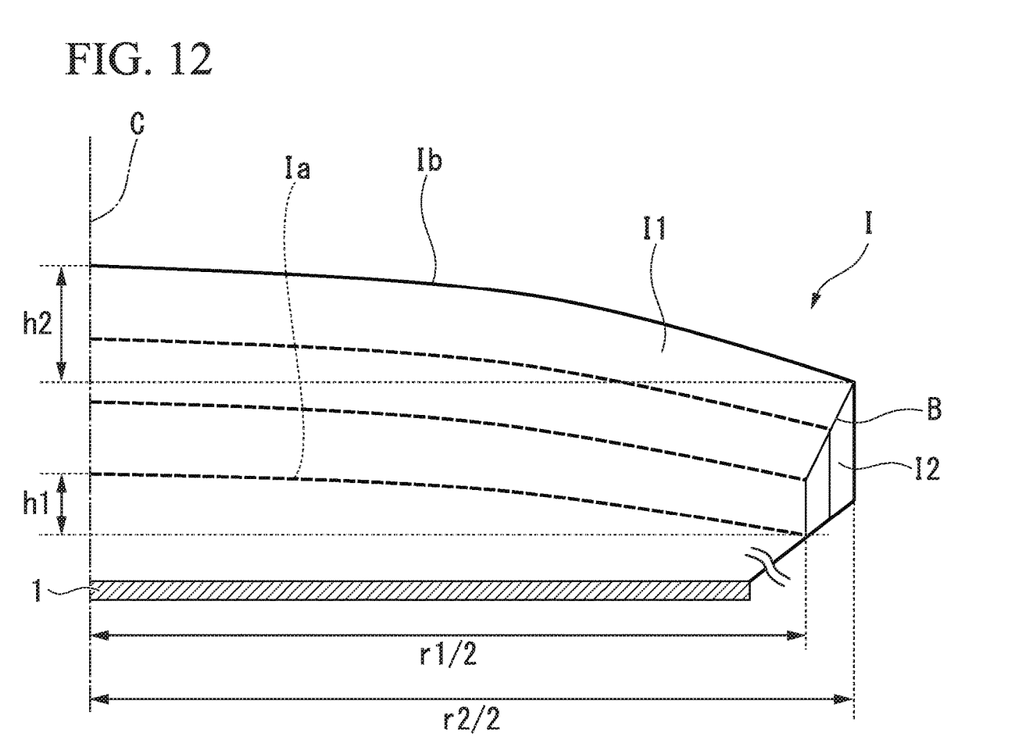
FIG. 12 is a diagram showing a state of a crystal growth process of a SiC ingot.

FIG. 12 is a diagram showing a state of a crystal growth process of a SiC ingot. As shown in FIG. 12, the SiC ingot I includes a c-plane growth region I1 and a lateral growth region I2.

The c-plane growth region I1 is a region where the crystal growth is performed in the <0001> direction perpendicular to the {0001} plane. On the other hand, the lateral growth region I2 is a region where raw material gas is supplied from the lateral plane of the SiC ingot in the growth process and the crystal growth is performed in a direction different from the <0001> direction. Since the crystal growth directions of the c-plane growth region I1 and the lateral growth region I2 are different from each other, there is a boundary B between the c-plane growth region I1 and the lateral growth region I2.

The lateral growth region I2 is crystal-grown by gathering the raw material gas around the lateral plane of the SiC ingot. That is, it is difficult to control the process of crystal growth. On the other hand, the c-plane growth region I1 grows along the isothermal line generated in the crucible 100 and thus can be controlled. That is, in the method of manufacturing the SiC ingot according to the present embodiment, the convexity of each growth front in the c-plane growth region I1 is controlled. Note that, the convexity will be described.

In the crystal growth step, in a case where the atomic arrangement plane of the SiC single crystal is the saddle type, the crystal growth condition when crystal-growing the SiC ingot I are set such that the convexity of the second growth front Ib at the end of the crystal growth is larger than the convexity of the first growth front Ia at the time when the amount of the crystal growth at the center of the seed crystal is 7 mm.

Here, "first growth front Ia and second growth front Ib" means an outer surface of the c-plane growth region I1 exposed in the crystal growth step. Therefore, these growth fronts do not coincide with the atomic arrangement planes 2. In addition, the "convexity" means a value obtained by dividing a difference (height difference h1, h2) between the amount of the crystal growth at a center line C passing through the center of the seed crystal and extending in a stacking direction and the amount of the crystal growth at the boundary B (end) between the c-plane growth region I1 and the lateral growth region I2, by a diameter (r1, r2) of the crystal growth front at that time. In other words, the "convexity" is a value obtained by dividing a difference (height difference) between a distance from the SiC single crystal, which is grown by a certain time, at the center of the crystal growth front and a distance from the SiC single crystal at the end on the c-plane growth front by a diameter when the growth front is viewed in plane.

Here, the first growth front Ia is defined as a crystal growth front at the time when the amount of crystal growth is 7 mm from the center of the seed crystal. At the stage where the amount of crystal growth is less than 7 mm, the end of the seed crystal evaporates and the shape changes, the flow of the raw material gas or the like is not stabilized, and the etching rate or the crystal growth rate of the seed crystal changes. That is, the crystal growth is not stabilized at the stage where the amount of the crystal growth is less than 7 mm. Therefore, it is difficult to control the convexity and to accurately define the convexity.

When the convexity of the second growth front Ib is made larger than the convexity of the first growth front Ia, the atomic arrangement plane 2 having the saddle type is flattened. The reason for this is assumed as follows.

In a case where the atomic arrangement plane 2 of the SiC single crystal is a bowl type as shown in FIG. 2, the length of the outer periphery 3 of the atomic arrangement plane is shorter than the length of the outer periphery 4 when the atomic arrangement plane 2 is flat. In contrast, in a case where the atomic arrangement plane 2 of the SiC single crystal is a saddle type as shown in FIG. 3, the length of the outer periphery 3 of the atomic arrangement plane is longer than the length of the outer periphery 4 when the atomic arrangement plane 2 is flat. It is considered that the difference in length of the outer periphery indicates the balance of the number density of atoms. That is, in the case of the bowl type, the number density of atoms becomes dense in the center portion and becomes sparse in the outer peripheral portion. In contrast, in the case of the saddle type, it is presumed that the number density of atoms becomes sparse in the center portion and becomes dense in the outer peripheral portion.

In a case where the crystal growth is performed using a SiC single crystal as a seed crystal, the growth surface shape is determined according to the shape of the isotherms. In the in-plane direction, when the outer peripheral portion is set to have a higher temperature than that of the center portion, the shape of the growth front becomes a convex shape, and when the outer peripheral portion is set to have a lower temperature than that of the center portion, the shape of the growth front becomes a concave shape. The outer peripheral portion grown at a higher temperature than that of the center portion has a coefficient of thermal expansion larger than that of the center portion, and the number density of atoms is lower than that of the center portion. In other words, making the convexity of the second growth front at the end of the crystal growth larger than the convexity of the first growth front at the initial stage of growth means making the temperature of the outer peripheral portion higher than the temperature of the center portion in the growth process. When the crystal growth is carried out under this condition, the center is dense and the outer periphery becomes sparse in the growth process. Therefore, even in the case of using a saddle type seed crystal (the number density of atoms is sparse in the center portion and dense in the outer peripheral portion) of the lattice plane, it is considered that by setting the convexity at the time of growth, the atomic arrangement plane is flattened due to the relationship between the sparse and dense balance of atoms at the center portion and the outer peripheral portion.

On the other hand, it is preferable that the crystal growth condition is set so that the convexity is gradually increased from the first growth front Ia toward the second growth front Ib at which the crystal growth is completed. When the convexity from the first growth front Ia is gradually increased toward the second growth front Ib, the occurrence of unnecessary stress can be avoided. Further, it is preferable that the height difference of the gradually is increased from the first growth front Ia toward the second growth front Ib. Here, the "height difference" means the difference between the height position of the center portion of the growth front and the height position of the outer peripheral portion (boundary B), in other words, the maximum value of the height difference of the growth front is the second growth front Ib. In the present specification, "height difference" means "a difference between the height position of the center portion of a growth front and a height position of an outer peripheral portion" unless otherwise is noted. In addition, "gradually" means that there is no time when the convexity (or height difference) is decreased from the first growth front Ia toward the second growth front Ib, and there may be a region where the convexity is constant in the middle. Ideally, it is better to gradually shift a shape of the isotherms to a steep convex shape in order to finally flatten the saddle type atomic arrangement plane. However, it is important that the final shape of the isotherms are convex with respect to the initial stage, that is, compared to the initial stage. That is, if it is difficult to gradually increase the convexity or the height difference, a region where the convexity is temporarily decreased may be included in the middle.

In addition, a difference between the height difference h1 of the first growth front Ia and the height difference h2 of the second growth front Ib is preferably 0.5 mm to 4.0 mm, is more preferably 1.0 mm to 4.0 mm, and is still more preferably 1.5 mm to 3.5 mm. If the difference (h2-h1) in the height difference of the growth fronts is excessively large, cracks and the like are likely to occur in the SiC ingot I in some cases. On the other hand, if the height difference (h2-h1) is small, the effect of flattening the atomic arrangement plane 2 may be diminished. For example, the height difference is preferably 0.5 mm or more when the diameter of the SiC single crystal 1 is 6 inches, and is preferably 1.0 mm or more when the diameter of the SiC single crystal 1 is 8 inches.

The preferable conditions in the process of manufacturing the SiC ingot I have been described so far. Next, a method for satisfying these conditions will be described.

The crystal growth is greatly influenced by a temperature during crystal growth. Therefore, the isotherms in the crucible 100 are set so that the first growth front Ia and the second growth front Ib satisfy a predetermined relationship. Setting of the isotherms can be made in advance using simulation or the like.

As a method of controlling the temperature distribution during crystal growth with respect to the crystal growth front, the method disclosed in JP-A-2008-290885 can be used. A sublimation crystal growth apparatus including two upper and lower heaters of an opposing heater positioned on the side plane of a point where the seed crystal is disposed, and an opposing heater positioned on the side plane of the point where a raw material is disposed, and including a partition wall portion formed of a heat insulating member between the upper and lower heaters, or the like can be used. It is possible to control the isotherms with respect to the plane of the seed crystal by preventing the heat from transmitting above the crucible from the lower heater by the partition wall.

When the crystal growth is performed by a sublimation method, if growth is performed while periodically changing a doping amount of nitrogen (N), the growth front becomes striped due to the difference in nitrogen (N) concentration. The growth front is sliced in the longitudinal sectional direction, and the shape of the growth front at each time can be obtained from the color changing interface. Therefore, it is possible to confirm whether or not the simulation result agrees with the actual growth conditions.

Maintaining the isotherms during the crystal growth can be realized by further combining other techniques. As a specific example, in order to correct the change in the shape of the growth front obtained in advance by the above-mentioned method, it is possible to combine techniques for moving the crucible during growth and matching the isotherms and the growth front height.

In addition, when the temperature gradient in the vicinity of the crystal being grown is large, the stress in the crystal becomes larger. Examples of the temperature gradient in the vicinity of the crystal includes a temperature gradient in the growth direction (growth axis direction) and a temperature gradient in the radial direction. The temperature gradient in the radial direction can be reduced by making the isotherms parallel to the plane of the seed crystal by using an apparatus including a partition wall portion and an upper and lower heater as described above. The temperature gradient in the direction of the growth axis can be more decreased by reducing the temperature difference between the seed crystal and the raw material.

When the temperature gradient is excessively small, the growth becomes unstable, and thus the temperature gradient is preferably about 50 $Kcm^{-1}$. By controlling both the temperature gradient in the direction of the growth axis and the temperature gradient in the radial direction with a small value in a range where the stable growth is possible, the occurrence of stress can be suppressed.

As described above, according to the method of manufacturing the SiC ingot according to the present embodiment, it is possible to manufacture a SiC ingot in which the atomic arrangement plane 2 is flattened.

Figure 13:
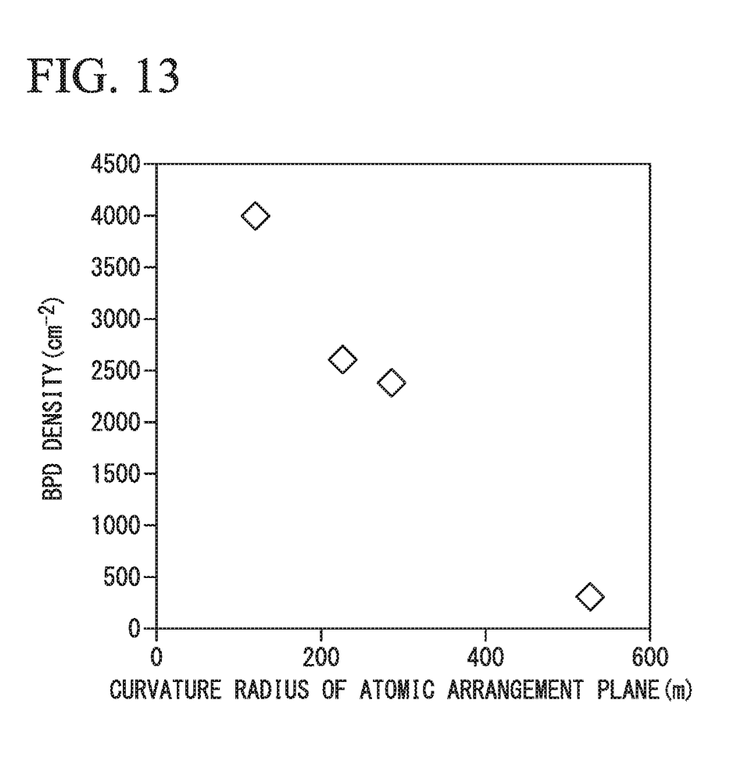
FIG. 13 is a graph showing a relationship between the radius of curvature of the atomic arrangement plane and a BPD density of the SiC single crystal.

FIG. 13 is a graph showing a relationship between the radius of curvature of the atomic arrangement plane and a BPD density of the SiC single crystal. As shown in FIG. 13, the radius of curvature of the atomic arrangement plane 2 and the BPD density have a corresponding relationship. As the radius of curvature of the atomic arrangement plane 2 is large (the amount of curvature of the atomic arrangement plane 2 is small), BPD density tends to be decreased. It is considered that the crystal in which the stress remains inside induces slippage on the crystal plane and curves the atomic arrangement plane 2 with the occurrence of BPD. Conversely, it is also considered that the atomic arrangement plane 2 having a large amount of curvature has strain and causes BPD. In either case, the BPD density is decreased as the radius of curvature of the atomic arrangement plane is large (that is, as the amount of curvature of the atomic arrangement plane is small).

That is, when the SiC ingot manufactured by the method of manufacturing the SiC ingot according to the present embodiment is cut out and used again as a seed crystal, a high-quality SiC ingot having a low BPD density can be obtained.

Finally obtained SiC ingot I is sliced to manufacture a SiC wafer. A wafer having a plane cut in a direction perpendicular to <0001> or at an off angle of 0° to 10°, parallel to the c-plane, or at an off angle of 0° to 10° from the c-plane is manufactured. For the plane processing of the wafer, mirror surface processing may be applied to the (0001) plane side, that is, the Si-face side. The Si-face is a plane on which epitaxial growth is normally performed. Since the SiC ingot manufactured again has less BPD, the SiC wafer having less BPD can be obtained. By using the SiC wafer with fewer BPDs as killer defects, a SiC epitaxial wafer with high quality can be obtained and the yield of the SiC device can be increased.

Further, when heating the crucible 100 to sublimate the raw material G, it is preferable to rotate the crucible 100 in the circumferential direction so as not to generate circumferential anisotropy. The rotational speed is preferably 0.1 rpm or higher. It is also preferable to reduce the temperature change in the growth front during crystal growth.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXAMPLES

Example 1

A 6 inch SiC single crystal was prepared. A curving direction of an atomic arrangement plane of the SiC single crystal was measured along a [1-100] direction and a [11-20] direction using X-ray diffraction (XRD). As a result, it was confirmed that the curving directions of these atomic arrangement planes are different, and the atomic arrangement planes are saddle type.

Next, a SiC ingot was produced using this SiC single crystal as a seed crystal. Then, crystal growth conditions were set such that the convexity of a crystal growth front (second growth front) at the end of the crystal growth is larger than the convexity of the crystal growth front (a first growth front) at the time when the crystal growth amount is 7 mm at the center of the seed crystal. Specifically, the temperature condition in the vicinity of the seed crystal was obtained in advance by simulation, and then the crystal growth was performed under the conditions that the convexity of the isotherms (height difference) was gradually increased from the first growth front toward the second growth front. Table 1 indicates the height difference which is obtained from a striped growth front due to the difference in nitrogen (N) concentration in Example 1. In Table 1, the growth height at the center means the amount of crystal growth at the center of the seed crystal. In addition, it can be said that the diameter of the crystal growth front does not change significantly during the growth process, and the convexity and the height difference are in a one-to-one relationship.

Comparative Example 1

Comparative Example 1 is different from Example 1 in that crystal growth was performed under the condition that the convexity of the isotherm was gradually decreased from the first growth front toward the second growth front. The other conditions were the same as those in Example 1. Table 1 indicates the height difference of the growth front in Comparative Example 1.

TABLE 1

| Example 1 | | Comparative Example 1 | |
|---|---|---|---|
| growth height at the center (mm) | Height difference (mm) | growth height at the center (mm) | Height difference (mm) |
| 7.3 | 1.8 | 7.2 | 1.8 |
| 17.9 | 1.9 | 17.0 | 1.8 |
| 26.8 | 2.9 | 24.6 | 0.6 |
| 32.5 | 3.8 | 30.6 | 0.3 |

Figure 14A:
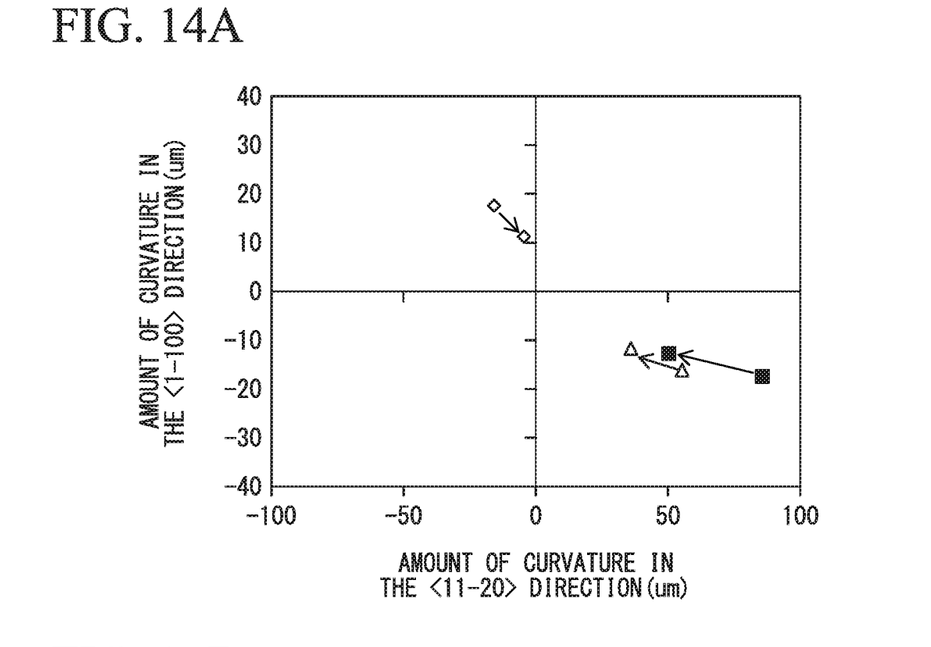
FIG. 14A illustrates a relationship between an amount of curvature of an atomic arrangement plane of a seed crystal in a [1-100] direction and a [11-20] direction before crystal growth and an amount of curvature of an atomic arrangement plane of a SiC ingot in a [1-100] direction and a [11-20] direction after crystal growth, in Example 1.
Figure 14B:
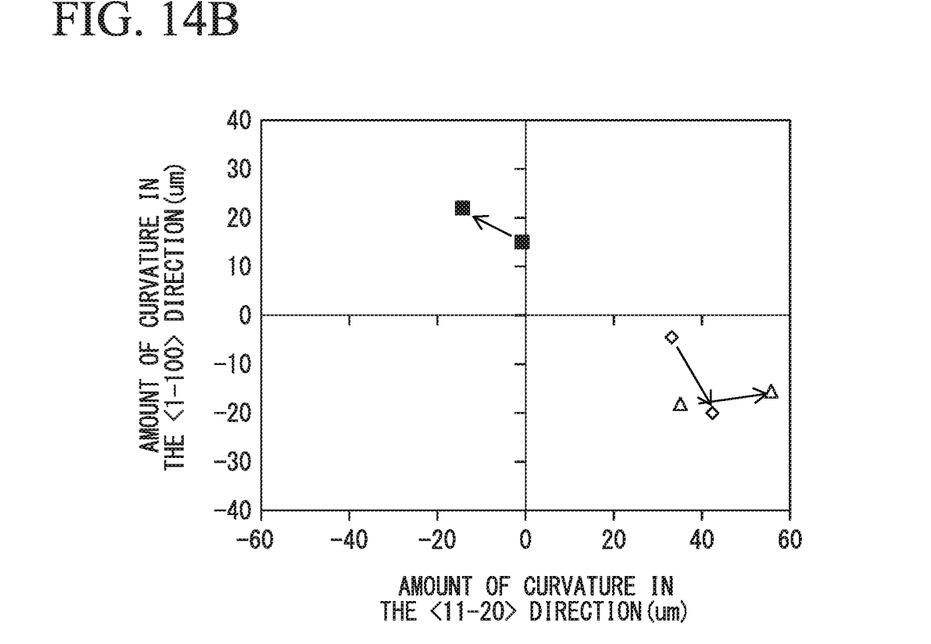
FIG. 14B illustrates a relationship between an amount of curvature of an atomic arrangement plane of a seed crystal in a [1-100] direction and a [11-20] direction before crystal growth, and an amount of curvature of an atomic arrangement plane of a SiC ingot in a [1-100] direction and a [11-20] direction after crystal growth, in Comparative Example 1.

As shown in Table 1, it was possible to control the convexity (warping amount) of the crystal growth front in Example 1 and Comparative Example 1 as a result of preliminary study of the simulation. FIGS. 14A and 14B illustrate a relationship between the amount of curvature of the atomic arrangement plane in the [1-100] direction (amount of curvature in the <1-100> direction) and the [11-20] direction (amount of the curvature in the <11-20> direction) of the seed crystal before the crystal growth and the amount of curvature of the atomic arrangement plane in the [1-100] direction and the [11-20] direction of the SiC ingot after crystal growth. FIG. 14A is a result of measurement of three samples obtained under the conditions of Example 1, and FIG. 14B is a result of measurement of three samples obtained under the condition of Comparative Example 1. The starting point of an arrow indicates the amount of curvature of the atomic arrangement plane in the seed crystal and an end point of the arrow indicates the amount of curvature of the atomic arrangement plane of the SiC ingot.

As shown in FIG. 14A, in any of the three samples under the conditions of Example 1, the curved state of the atomic arrangement plane changed in the direction toward the origin (the amount of curvature is 0). On the other hand, as shown in FIG. 14B, under the condition of Comparative Example 1, the curved state of the atomic arrangement plane changed in a direction away from the origin in any of the three samples. The origin of the graph corresponds to a state in which the atomic arrangement plane is not curved at all. That is, it is understood that when the crystal growth is performed under the conditions of Example 1, the curvature of the atomic arrangement plane is relaxed as compared with Comparative Example 1.

INDUSTRIAL APPLICABILITY

The method of manufacturing a SiC ingot according to the present invention can provide a SiC ingot having a small amount of curvature of the atomic arrangement plane necessary for providing a high quality SiC wafer by using correlation between the amount of curvature of atomic arrangement plane (lattice plane) of the SiC single crystal and basal plane dislocation (BPD) density.

EXPLANATION OF REFERENCES 1, 10 SiC SINGLE CRYSTAL
2, 22 ATOMIC ARRANGEMENT PLANE
3 OUTER PERIPHERY OF ATOMIC ARRANGEMENT PLAN
4 OUTER PERIPHERY IN A CASE WHERE ATOMIC ARRANGEMENT PLANE IS FLATTENED
20 WAFER
100 CRUCIBLE
101 COIL
102 TAPERED GUIDE
103 PEDESTAL
A ATOM
I SiC INGOT
Ia FIRST GROWTH FRONT
Ib SECOND GROWTH FRONT
I1 c-plane Growth Region
I2 LATERAL GROWTH REGION
B BOUNDARY
G RAW MATERIAL
F1, F2 FORCE
d, d1 AMOUNT OF CURVATURE OF ATOMIC ARRANGEMENT PLANE
r RADIUS OF WAFER
Δθ DIFFERENCE OF X-RAY DIFFRACTION PEAK ANGLE BETWEEN MEASURED TWO POINTS
φ CENTRAL ANGLE OF SECTOR INCLUDING ARCS WITH CONTACTS AT BOTH ENDS
x DISTANCE FROM CENTER OF WAFER
y RELATIVE DISTANCE OF ATOMIC ARRANGEMENT PLANE
h1 HEIGHT DIFFERENCE OF FIRST
h2 HEIGHT DIFFERENCE OF SECOND GROWTH FRONT

What is claimed is:

1. A method of manufacturing a SiC ingot, comprising:
a measuring step of measuring a curving direction of an atomic arrangement plane of a SiC single crystal at least along a first direction passing through a center in plan view and a second direction intersecting with the first direction so as to obtain a shape of the atomic arrangement plane; and
a crystal growth step of performing crystal growth using the SiC single crystal as a seed crystal,
wherein in a case where the shape of the atomic arrangement plane measured in the measuring step is a saddle type that the curving direction of the atomic arrangement plane is different in the first direction and the second direction, a crystal growth condition in the crystal growth step is set such that a convexity of a second growth front at the end of crystal growth becomes larger than a convexity of a first growth front when the amount of crystal growth in the center of the seed crystal is 7 mm.

2. The method of manufacturing a SiC ingot according to claim 1,
wherein the crystal growth condition in the crystal growth step is set such that the convexity is gradually increased toward second growth front from the first growth front.

3. The method of manufacturing a SiC ingot according to claim 1,
wherein in the crystal growth step, a height difference of the growth front is gradually increased toward the second growth front from the first growth front.

4. The method of manufacturing a SiC ingot according to claim 2,
wherein in the crystal growth step, a height difference of the growth front is gradually increased toward the second growth front from the first growth front.

5. The method of manufacturing a SiC ingot according to claim 1,
wherein a difference between a height difference of the first growth front and a growth front height difference of the second growth front is 0.5 mm to 4.0 mm.

6. The method of manufacturing a SiC ingot according to claim 2,
wherein a difference between a height difference of the first growth front and a growth front height difference of the second growth front is 0.5 mm to 4.0 mm.

7. The method of manufacturing a SiC ingot according to claim 3,
wherein a difference between a height difference of the first growth front and a growth front height difference of the second growth front is 0.5 mm to 4.0 mm.

8. The method of manufacturing a SiC ingot according to claim 1,
wherein the measuring step of obtaining the shape of the atomic arrangement plane includes a first substep of preparing the SiC single crystal, or the SiC single crystal that is sliced, as a sample, determining a diffraction plane at two points which are on a straight line passing through a center of the sample in plan view and at the same distance from the center, and performing XRD so as to obtain a difference Δθ between peak angles of X-ray diffraction as a difference between inclinations of the atomic arrangement planes at two points, a second substep of repeating the same operation as that in the first substep by changing the two points of positions one or more times, a third substep of obtaining a radius of curvature of the atomic arrangement plane from the obtained 2 or more Δθ and 2 or more distances from the center of the sample, and a fourth substep of obtaining an amount of curvature of the atomic arrangement plane from the obtained radius of curvature of the atomic arrangement plane and a radius of the sample.

9. The method of manufacturing a SiC ingot according to claim 8, further comprising:

a fifth substep of performing the first to fourth substeps in both the first direction and the second direction intersecting with the first direction.

10. The method of manufacturing a SiC ingot according to claim 9, further comprising:

a sixth substep of determining whether or not a curving direction of the atomic arrangement plane is different between the first direction and the second direction by evaluating the result of the fifth substep.

11. The method of manufacturing a SiC ingot according to claim 1, wherein the measuring step of obtaining the shape of the atomic arrangement plane includes a first substep of preparing the SiC single crystal, or the sliced SiC single crystal that is sliced, as a sample, determining a diffraction plane at two points which are on a straight line passing through a center of the sample in plan view and at the same distance from the center, and performing XRD so as to obtain a difference Δθ between peak angles of X-ray diffraction as a difference between inclinations of the atomic arrangement planes at two points, a second substep of repeating the same operation as that in the first substep by changing the two points of positions one or more times, a third substep of obtaining each of relative atom positions of the atomic arrangement plane from the each obtained Δθ and each distance from the center of the sample, and fourth substep of evaluating each obtained atom position of the atomic arrangement plane.

12. The method of manufacturing a SiC ingot according to claim 11, further comprising:

a fifth substep of performing the first to fourth substeps in both the first direction and the second direction intersecting with the first direction.

13. The method of manufacturing a SiC ingot according to claim 12, further comprising:

a sixth substep of determining whether or not a curving direction of the atomic arrangement plane is different between the first direction and the second direction by evaluating the result of the fifth substep.

14. The method of manufacturing a SiC ingot according to claim 1, wherein the crystal growth step is a growth step of the SiC ingot, wherein the SiC ingot includes a c-plane growth region and a lateral growth region, and wherein the convexity is a value obtained by dividing a difference between an amount of crystal growth of the growth front of the SiC ingot at a center line C passing through the center of the seed crystal and extending in a stacking direction and an amount of crystal growth of the growth front of the SiC ingot at a boundary between the c-plane growth region and the lateral growth region, by a diameter of the growth front.

* * * * *